(12) United States Patent
Takeuchi et al.

(10) Patent No.: US 6,201,421 B1
(45) Date of Patent: Mar. 13, 2001

(54) WRITE CURRENT DRIVING CIRCUIT

(75) Inventors: Toru Takeuchi; Takehiko Umeyama, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/349,226

(22) Filed: Jul. 8, 1999

(30) Foreign Application Priority Data

Mar. 19, 1999 (JP) .................................................. 11-075012

(51) Int. Cl.[7] ................................. H03B 1/00; H03K 3/00
(52) U.S. Cl. ........................... 327/110; 327/423; 327/588
(58) Field of Search .......................... 327/423, 108–112, 327/587–588, 170, 134, 454, 508; 360/46, 67, 68; 318/139

(56) References Cited

U.S. PATENT DOCUMENTS

| | | | | |
|---|---|---|---|---|
| 4,961,144 | * | 10/1990 | Yabe et al. ............................. | 701/43 |
| 5,309,347 | * | 5/1994 | Poma et al. ........................... | 327/423 |
| 5,332,954 | * | 7/1994 | Lankin ................................. | 318/319 |
| 5,631,595 | * | 5/1997 | Lakshmikumar ..................... | 327/110 |
| 5,781,026 | * | 7/1998 | Chow ................................... | 326/27 |
| 5,852,526 | * | 12/1998 | Huntington .......................... | 360/66 |
| 5,892,382 | * | 4/1999 | Ueda et al. .......................... | 327/199 |

FOREIGN PATENT DOCUMENTS 9-219004   8/1997 (JP) .

* cited by examiner

*Primary Examiner*—Terry D. Cunningham
*Assistant Examiner*—Long Nguyen
(74) *Attorney, Agent, or Firm*—Burns, Doane, Swecker & Mathis, LLP (57) ABSTRACT

A write current driving circuit in which drains of the transistors A1 and B1 are commonly connected to the base of the transistor T1, drains of the transistors C1 and D1 are commonly connected to the base of the transistor T2, inverted signal of the input signal into the transistors C1 and D1 is inputted into the transistors A1 and B1. Therefore, the transistors T1 and T2 can speedily be switched ON/OFF with suppressed power consumption. Transistors A2, C2 and transistors B2, D2 are connected in parallel with the transistors A1, C1 and NMOS transistors B1, D1 respectively, and the transistors A2, C2, B2, and D2 are turned ON only for a specified period of time immediately after the transistors T1 and T2 are switched ON/OFF.

5 Claims, 8 Drawing Sheets

WRITE CURRENT DRIVING CIRCUIT

FIELD OF THE INVENTION

The present invention relates to a write current driving circuit used for a hard disk drive (HDD), a floppy disk drive (FDD) or the like.

BACKGROUND OF THE INVENTION

Figure 8:
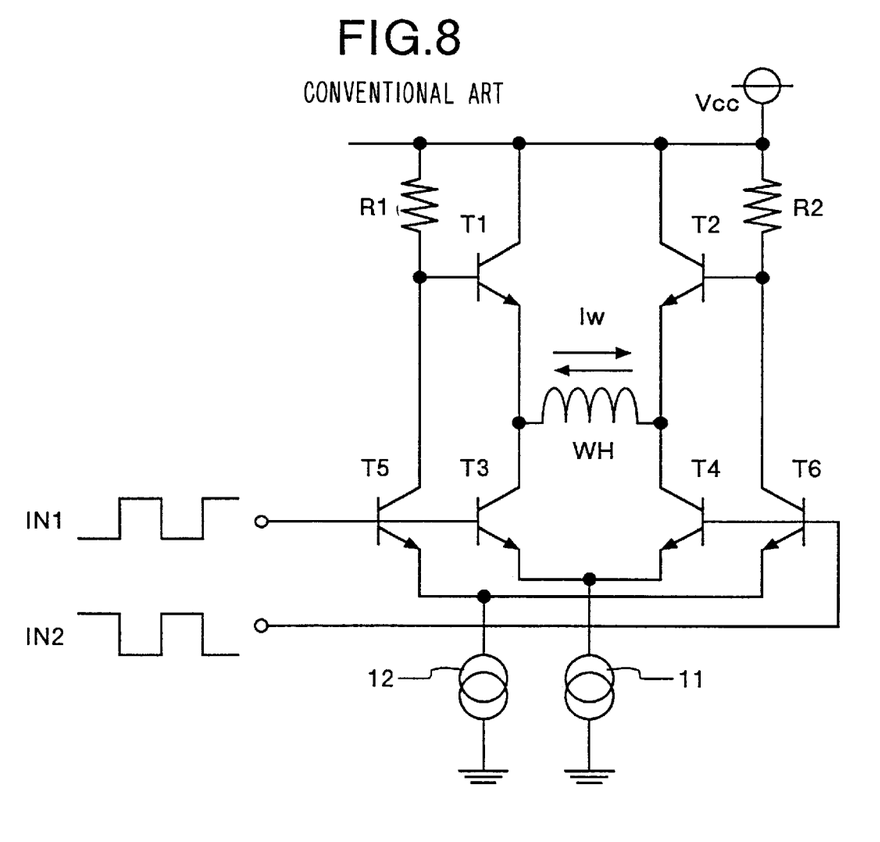
FIG. 8 is a circuit diagram showing a write current driving circuit based on the conventional technology.

FIG. 8 is a circuit diagram showing a write current driving circuit based on the conventional technology. This write current driving circuit comprises two NPN transistors T1, T2 on the current-supply side; two NPN transistors T3, T4 on the current-extraction side; a write head WH made up of a coil; two NPN transistors T5, T6 for biasing a base potential of the transistors T1, T2; and two loading resistors R1, R2.

Collectors of the transistors T1 and T2 are connected to a power supply unit Vcc. Bases of the transistors T1 and T2 are connected to the power supply unit Vcc through the resistors R1 and R2 respectively. Emitters of the transistors T1 and T2 are connected to the collectors of the transistors T3 and T4 respectively.

Signals IN1 and IN2 inputted from external devices are supplied as base potentials to the bases of the transistors T3 and T4 respectively. The input signal IN2 is an inverted signal of the other input signal IN1. Emitters of the transistors T3 and T4 are commonly connected to a current source 11, thus a current flows from the emitters of the transistors T3 and T4 into the current source 11.

Collectors of the transistors T5 and T6 are connected to the bases of the transistors T1 and T2 respectively. Base potentials are fed by the signals IN1 and IN2 to the bases of the transistors T5 and T6 respectively. Emitters of the transistors T5 and T6 are commonly connected to a current source 12, thus a current flows from the emitters of the transistors T5 and T6 into the current source 12.

One end of the coil of the write head WH is connected to the emitter of the transistor T1 and the collector of the transistor T3. The other end is connected to the emitter of the transistor T2 and to the collector of the transistor T4.

Effects of the write current driving circuit configured as shown in FIG. 8 will be described below. When one input signal IN1 is at a relatively high potential level (described as HIGH hereinafter) and the other input signal IN2 is at a relatively low potential level (described as LOW hereinafter), the transistors T3 and T5 are ON, while the transistors T4 and T6 are OFF.

As the transistor T5 is ON, a current passes through the loading resistor R1. With that current, a base potential of the transistor T1 drops and the transistor T1 is turned OFF. On the other hand, as the transistor T6 is OFF, a current does not pass through the loading resistor R2. Accordingly, a base potential of the transistor T2 is maintained at the power supply potential as it is, and so the transistor T2 is turned ON. Therefore, an emitter current of the transistor T2 passes through the write head WH from the side of the transistor T2 toward the side of the transistor T3, and becomes a collector current of the transistor T3.

When the input signal IN1 is LOW and the other input signal IN2 is HIGH, the transistors T3 and T5 are OFF while the transistors T4 and T6 are ON. Accordingly, a current passes through the loading resistor R2, and with that current, a base potential of the transistor T2 drops, and the transistor T2 is turned OFF. On the other hand, as the transistor T5 is OFF, a current does not pass through the loading resistor R1, and so a base potential of the transistor T1 is maintained at the power supply potential as it is, and the transistor T1 is turned ON.

Therefore, an emitter current of the transistor T1 passes through the write head WH from the side of the transistor T1 toward the side of the transistor T4, and becomes a collector current of the transistor T4. As described above, by inputting a pair of inverted signals IN1 and IN2, a current passing through the write head WH, namely a direction of a write current to a disk is switched.

In recent years, it has been desired that data is written in a hard disk or the like with higher speed. To increase the writing speed, it is required to increase the switching speed when a direction of a write current is switched and also to speed up a rise time (Tr) and a fall time (Tf) of the current on switching.

In the conventional type of write current driving circuit shown in FIG. 8, however, there are base-emitter capacitor and base-collector capacitor in input sections of the transistors T1 and T2, and the capacities form a low-pass filter together with the loading resistors R1 and R2. The formed filter makes frequency response worse, and so the rise time and the fall time of a write current when the direction of the write current is switched becomes longer. If resistances of the loading resistors R1 and R2 are made smaller to overcome the problem, a current required to supply a base voltage to the transistors T1 and T2 becomes larger, which requires larger power consumption.

SUMMARY OF THE INVENTION

It is an object of the present invention to obtain, for the purpose of solving the problems as described above, a write current driving circuit with which switching a direction of a write current can be speeded up with suppressed power consumption.

With the present invention, the ON/OFF state of a first PMOS transistor and a first NMOS transistor switches concurrently, the ON/OFF state of the first PMOS transistor and a second PMOS transistor switches concurrently, and the ON/OFF state of a second PMOS transistor and a second NMOS transistor switches concurrently, and so a direction of a current passing through a resistive element changes in response to switching of the ON/OFF state among those PMOS transistors and NMOS transistors. Only when the first PMOS transistor, second PMOS transistor, first NMOS transistor, and second NMOS transistor switch from an OFF state to an ON state, the third PMOS transistor, fourth PMOS transistor, third NMOS transistor, and fourth NMOS transistor are turned ON.

With the present invention, ON/OFF of a first current-supply transistor is switched in response to switching of the ON/OFF state of the first PMOS transistor and first NMOS transistor, and ON/OFF of a second current-supply transistor is switched in response to switching of the ON/OFF state of the second PMOS transistor and second NMOS transistor.

With the present invention, ON/OFF of a first current-extraction transistor and a second current-extraction transistor is switched by the switching elements connected to the emitters thereof respectively.

With the present invention, ON/OFF of a first current-supply transistor and a second current-supply transistor is switched according to the outputs from a first CMOS inverter circuit and a second CMOS inverter circuit.

With the present invention, source potentials of a first NMOS transistor, a second NMOS transistor, a third NMOS transistor, and a fourth NMOS transistor are kept at a prespecified potential which is higher than the ground potential.

Other objects and features of this invention will become understood from the following description with reference to the accompanying drawings.

DESCRIPTION OF THE PREFERRED EMBODIMENTS

Detailed description is made hereinafter for Embodiments of the write current driving circuit according to the present invention with reference to the attached drawings.

Figure 1:
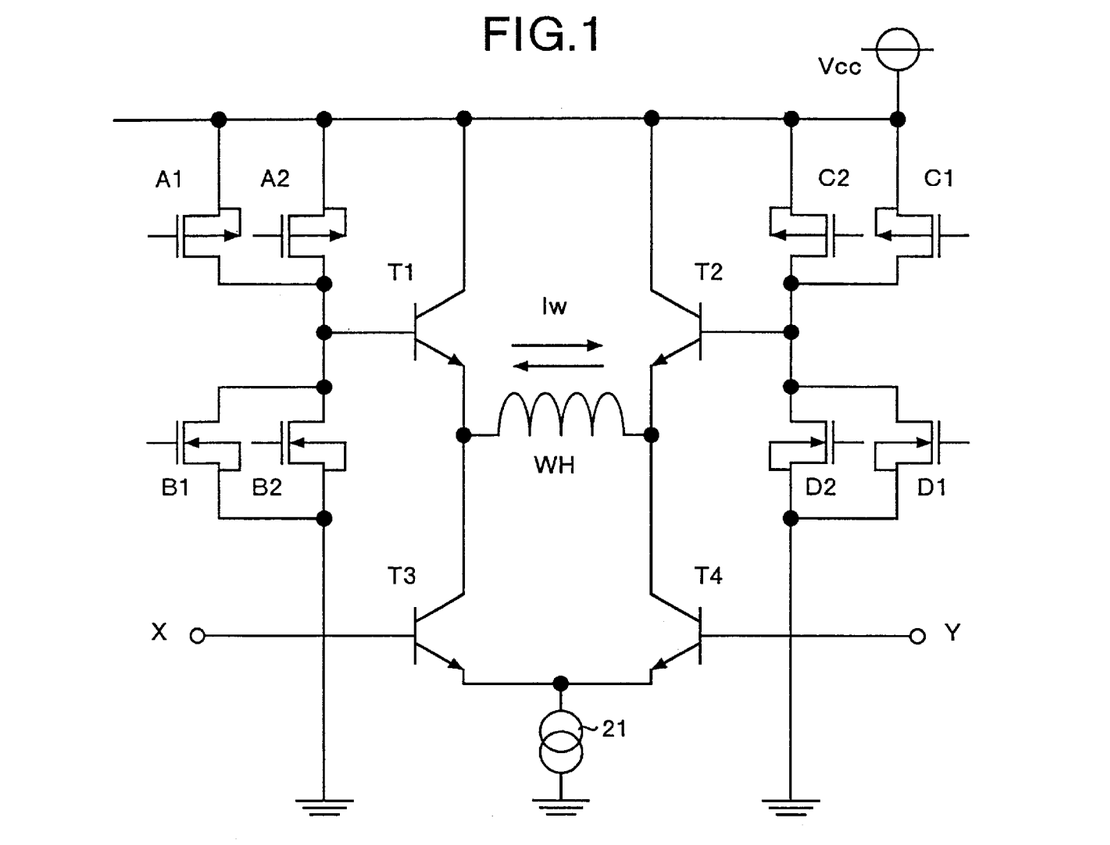
FIG. 1 is a circuit diagram showing Embodiment 1 of the present invention.

FIG. 1 is a circuit diagram showing Embodiment 1 of the write current driving circuit according to the present invention. This write current driving circuit comprises two NPN transistor T1, T2 on the current-supply side; two NPN transistor T3, T4 on the current-extraction side; a write head WH made up of a resistive element (a coil); PMOS transistors A1, A2 and NMOS transistors B1, B2 each for switching the transistor T1 ON/OFF by supplying a base potential to the transistor T1; and PMOS transistors C1, C2 and NMOS transistors D1, D2 each for switching the transistor T2 ON/OFF by supplying a base potential to the transistor T2.

Collector of the transistor T1 is connected to a power supply unit Vcc. The base of the transistor T1 is commonly connected to the drains of the PMOS transistors A1, A2 and the NMOS transistors B1, B2. The emitter of the transistor T1 is connected to the collector of the transistor T3.

Collector of the transistor T2 is connected to the power supply unit Vcc. The base of the transistor T2 is commonly connected to the drains of the PMOS transistors C1, C2 and the MOS transistors D1, D2. The emitter of the transistor T2 is connected to the collector of the transistor T4.

The bases of the transistors T3 and T4 each have a base potential fed thereto by signals X and Y inputted from external devices respectively to be turned ON/OFF according to the base potential. The input signal Y is an inverted signal of the input signal X. The emitters of the transistors T3 and T4 are commonly connected to a current source 21, thus a current flows from the emitters of the transistors T3 and T4 into the current source 21.

Sources of the PMOS transistors A1, A2, C1, and C2 are connected to the power supply unit Vcc, and control signals are inputted into the gates thereof from external devices. Drains of the PMOS transistors A1, A2, C1, and C2 are connected, as described above, to the drains of the NMOS transistors B1, B2, D1, and D2 respectively. Sources of the NMOS transistors B1, B2, D1, and D2 are connected to the ground, and control signals are inputted from external devices into the gates thereof.

One end of the coil of the write head WH is connected to the emitter of the transistor T1 and to the collector of the transistor T3. The other end of the coil is connected to the emitter of the transistor T2 and to the collector of the transistor T4.

Figure 2:
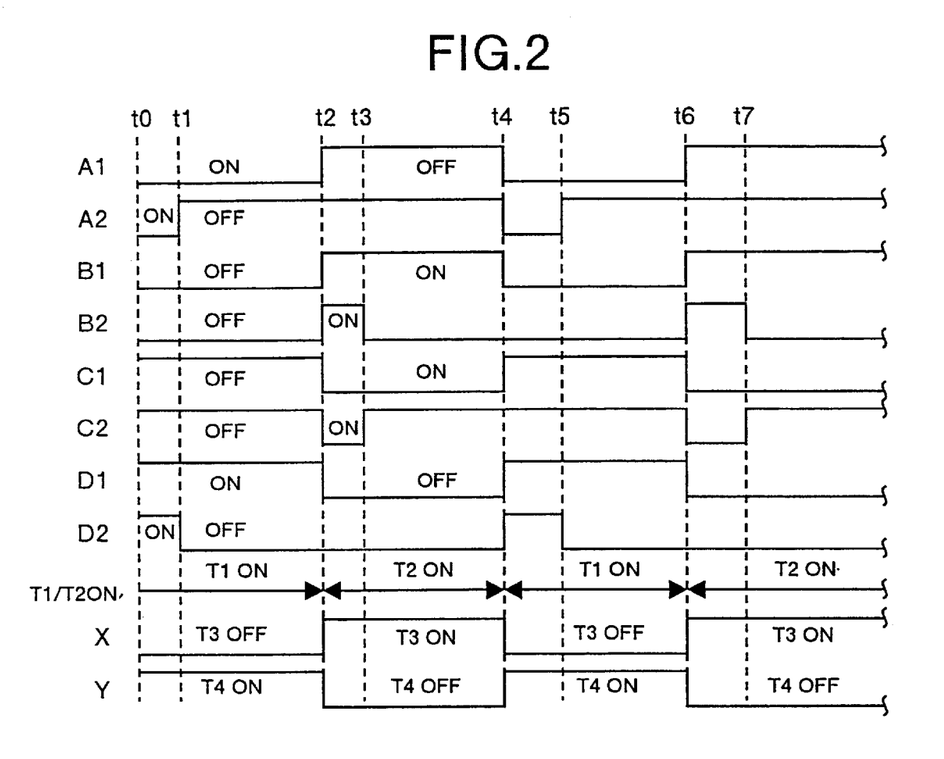
FIG. 2 is a time chart for explaining an operation of Embodiment 1.

Effects due to Embodiment 1 will be described. FIG. 2 is a time chart showing how the input signals into the gates of the MOS transistors A1, A2, B1, B2, C1, C2, D1, and D2 and input signals X, Y into the bases of the transistors T3, T4 change, and also show the ON/OFF state of the MOS transistors A1, A2, B1, B2, C1, C2, D1, and D2 as well as of the transistors T1, T2, T3, and T4. In the description below, input signals into the gates of the MOS transistors A1, A2, B1, B2, C1, C2, D1, and D2 are described as signals A1, A2, B1, B2, C1, C2, D1, and D2 respectively for the sake of convenience.

During a period (t0 to t1) from a certain timing t0 to the following timing t1, the signals A1, A2, B1, B2, and X are LOW, while the signals C1, C2, D1, D2, and Y are HIGH. Consequently, the transistors A1 and A2 are ON and the transistors B1 and B2 are OFF, so that a base voltage of the transistor T1 is HIGH, and the transistor T1 enters in an ON state. The transistor T3 is in an OFF state.

On the other hand, the transistors C1 and C2 are OFF and the transistors D1 and D2 are ON during the period t0 to t1. Therefore, the base voltage of the transistor T2 is LOW, and the transistor T2 enters in an OFF state. The transistor T4 is in an ON state.

At the timing t1, the signal A2 is switched to HIGH and the signal D2 is switched to LOW. The levels of the other signals A1, B1, B2, C1, C2, D1, X, and Y are unchanged. Accordingly, during the period (t1 to t2) from the timing t1 to the following timing t2, only the state of the transistor A2 and transistor D2 is changed, so that both transistors A2 and D2 enter in an OFF state. An ON/OFF state of the other transistors A1, B1, B2, C1, C2, and D1 is the same as that during the period t0 to t1, and so the transistor T1 is ON while the transistor T2 is OFF.

Since the level of the signals X and Y does not change, the transistor T3 is OFF and the transistor T4 is ON.

Accordingly, an emitter current of the transistor T1 flows through the write head WH from the side of the transistor T1 toward the side of the transistor T4, and becomes a collector current of the transistor T4.

At the timing t2, the signals A1, B1, B2 and X switch to HIGH, and the signals C1, C2, D1, and Y switch to LOW. The level of the signals A2 and D2 is unchanged. Accordingly, the transistors A1 and A2 are OFF, and the transistors B1 and B2 are turned ON, so that the base voltage of the transistor T1 is LOW, and the transistor T1 switches from an ON state to an OFF state. Further, the transistor T3 switches from an OFF state to an ON state. The transistors C1 and C2 are ON, and the transistors D1 and D2 are OFF, so that the base voltage of the transistor T2 is HIGH, and the transistor T2 switches from an OFF state to an ON state. Further, the transistor T4 switches from an ON state to an OFF state.

Figure 3:
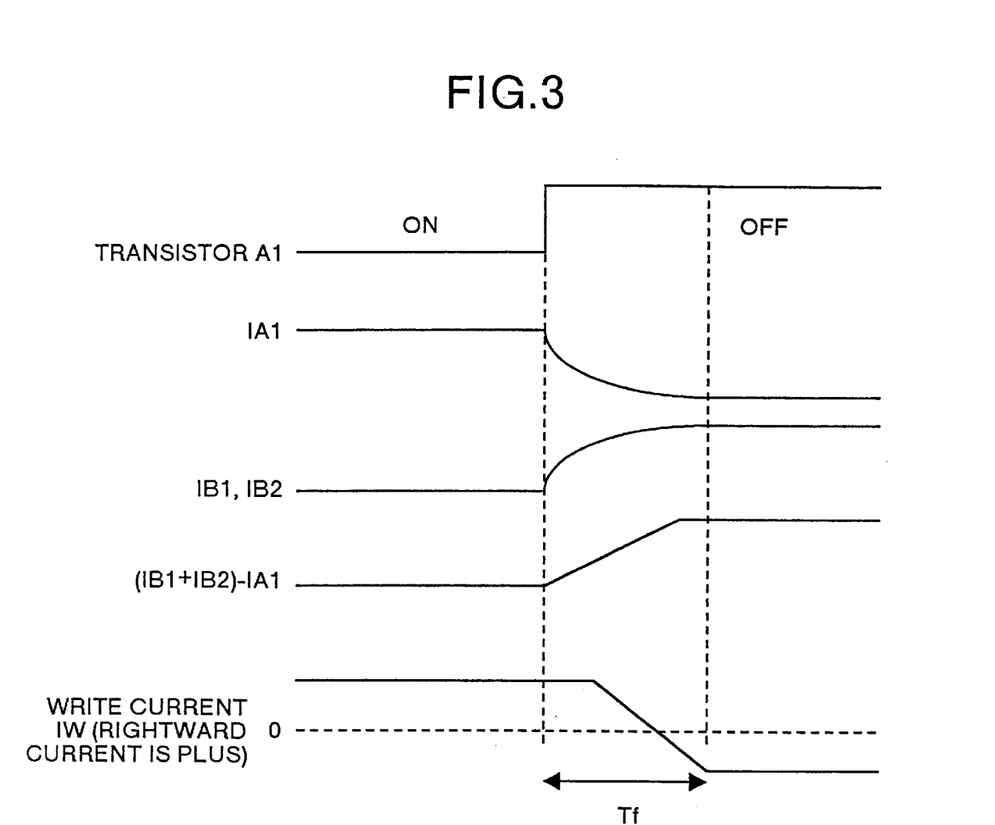
FIG. 3 is a signal waveform diagram for explaining the operation of Embodiment 1.

Herein, there is actually a time lag from a point of time when switching of the ON/OFF state among the transistors A1, B1, and B2 starts in response to change in the level of each of the signals A1, B1, and B2 until a point of time when the switching of the ON/OFF state thereamong completes, and so the direction of a write current flowing through the write head WH does not switch concurrently with the change in the level of the signals. In other words, as shown in FIG. 3, after the level of each of the signals A1, B1, and B2 is changed, the current IA1 flowing from the source to the drain of the transistor A1 gradually becomes smaller in association with the passage of time, while the currents IB1 and IB2 flowing from the drain of the transistors B1 and B2 to the source respectively gradually becomes larger. As a result, the current indicated by an expression [(IB1+IB2)−IA1] is extracted from the base of the transistor T1.

When the base potential of the transistor T1 drops due to the extraction of this current, the transistor T1 switches from an ON state to an OFF state, and the direction of the write current switches. The time spent for this period is a rise time (Tr) or a fall time (Tf) of the write current. During the period (t2 to t3) from the timing t2 to the timing t3 in this embodiment, both the transistors B1 and B2 enter in an ON state, therefore a larger amount of current is extracted from the base of the transistor T1 in a short period of time.

Further, immediately before the transistor T1 switches from an ON state to an OFF state, namely during the period t1 to t2, only the transistor A1 of the transistors A1 and A2 is ON, therefore, a small amount of current is fed to the base of the transistor T1. Accordingly, a small amount of charge is accumulated in the capacitor of the base section when the transistor T1 switches to an OFF state, and so the current is extracted from the base of the transistor T1 in a shorter period of time.

Thus, the transistor T1 speedily switches from an ON state to a complete OFF state by means of a synergistic effect derived from the fact that only the transistor T1 is ON immediately before the switching and the transistors B1 and B2 are ON immediately after the switching. It should be noted that the transistor A1 has an ability to pass a base current sufficient enough to maintain the transistor T1 in an ON state during the period t1 to t2.

As for the transistor T2, on the other hand, both the transistors C1 and C2 for supplying a current to the base of the transistor T2 are turned ON when the OFF state is switched to an ON state, and so, a larger amount of current is supplied to the base of the transistor T2 in a short period of time. Further, during the period t1 to t2 immediately before the transistor T2 switches from an OFF state to an ON state, only the transistor D1 of the current-extraction transistors D1 and D2 is ON, therefore, a current for extracting the charge accumulated in the base of the transistor T2 is made smaller by the transistors C1 and C2.

The transistor T2 speedily switches from an OFF state to a complete ON state by means of the synergistic effects. It should be noted that when the transistor T2 is OFF, a current is not required to be passed through the base thereof, and so it is sufficient that only the transistor D1 is ON.

During the period (t2 to t3) from the timing t2 to the following timing t3, the transistors A1, A2, D1, D2, T1, and T4 are OFF, while the transistors B1, B2, C1, C2, T2, and T3 are ON.

At the timing t3, the signal B2 switches to LOW, and the signal C2 switches to HIGH. Level of the other signals A1, A2, B1, C1, D1, D2, X, and Y is unchanged. Accordingly, during the period (t3 to t4) from the timing t3 to the following timing t4, only the state of the transistor B2 and transistor C2 changes, and both the transistor B2 and transistor C2 enter in an OFF state. The ON/OFF state of the other signals A1, A2, B1, C1, D1, and D2 is the same as that during the period t2 to t3, and so the transistor T1 is OFF while the transistor T2 is ON.

Since the level of the signals X and Y also does not change, the transistor T3 is ON while the transistor T4 is OFF. Accordingly, an emitter current of the transistor T2 flows through the write head WH from the side of the transistor T2 toward the side of the transistor T3, and becomes a collector current of the transistor T3.

During the period (t4 to t5) from the timing t4 to the following timing t5, the transistors A1 and A2 are ON, the transistors B1 and B2 are OFF, the transistors C1 and C2 are OFF, and the transistors D1 and D2 are ON. Accordingly, similarly to the effects in the description for the fact that the ON/OFF state of the transistor T1 and transistor T2 speedily switches during the period t2 to t3, the transistor T2 is speedily switched from an ON state to an OFF state and the transistor T1 is speedily switched from an OFF state to an ON state during the period t4 to t5. As each state of the transistors during the period t4 to t5 is the same as that during the period t0 to t1, the transistor T2 is speedily switched from an ON state to an OFF state and the transistor T1 is speedily switched from an OFF state to an ON state also during the period t4 to t5.

The period from the timing t5 to the following timing t6 and the period from the timing t6 to the following timing t7 are the same as the period from the timing t1 to t2 and the period from the timing t2 to t3 respectively, and after the timing t7 and on, the timing described above is repeated.

With Embodiment 1, the drains of the PMOS transistor A1 and NMOS transistor B1 are commonly connected to the base of the current-supply NPN transistor T1, the drains of the PMOS transistor C1 and NMOS transistor D1 are commonly connected to the base of the current-supply NPN transistor T2, and inverted signals of the input signals into the transistors C1 and D1 in the side of the transistor T2 are inputted into the transistors A1 and B1 in the side of the transistor T1, so that current supply or current extraction to or from each of the bases of those transistors T1 and T2 is speedily executed when the transistors T1 and T2 are switched ON/OFF, and so ON/OFF of the transistors T1 and T2 is speedily switched, which allows the direction of a write current to be speedily switched.

In addition, with Embodiment 1, the PMOS transistors A2, C2 and the NMOS transistor B2, D2 are connected in parallel with the PMOS transistors A1, C1 and the NMOS transistor B1, D1 respectively, and the PMOS transistors A2, C2 and the NMOS transistor B2, D2 each connected in parallel therewith are turned ON only for a specified period of time immediately after switching ON/OFF of the transistors T1 and T2, so that current drain can be suppressed and ON/OFF of the transistor T1 and transistor T2 can further speedily be switched because current supply or current extraction to or from each of the bases of the transistor T1 and transistor T2 can furthermore speedily be performed.

Figure 4:
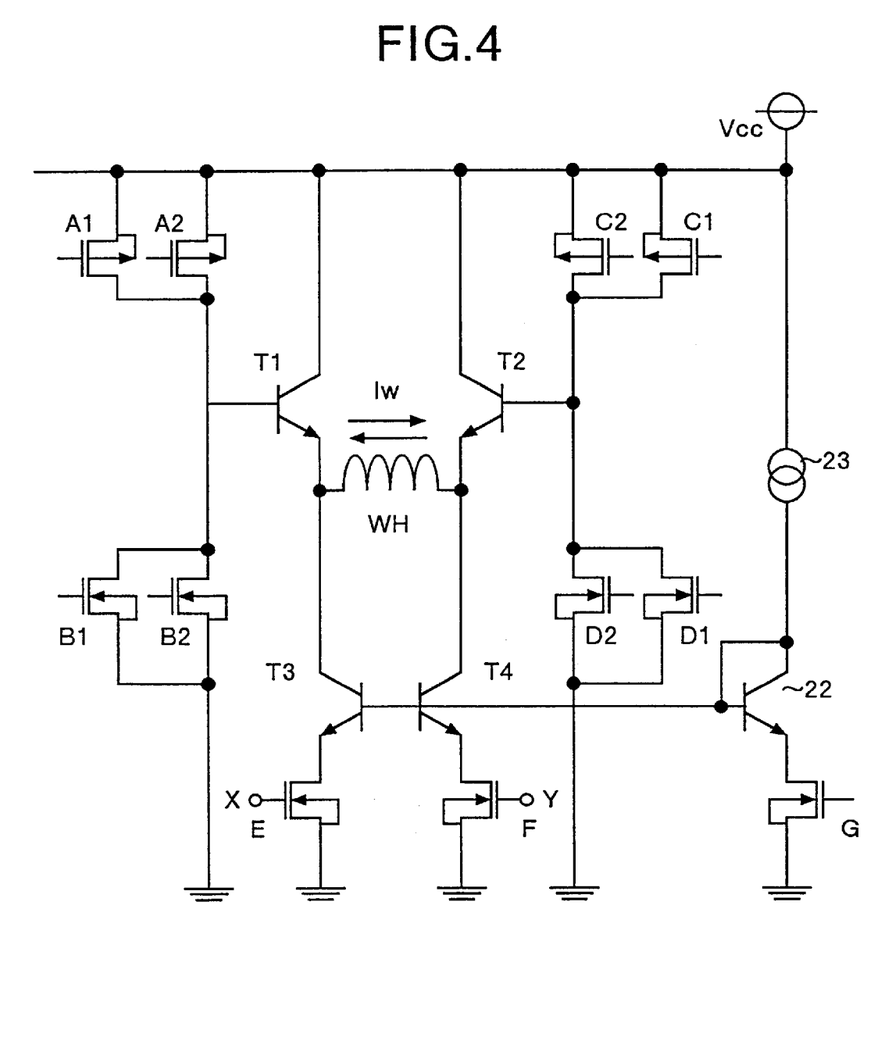
FIG. 4 is a circuit diagram showing Embodiment 2 of the present invention.

FIG. 4 is a circuit diagram showing Embodiment 2 of the write current driving circuit according to the present invention. This write current driving circuit is different from that of Embodiment 1 in that a current mirror circuit comprising an NPN transistor 22 with the collector and base thereof short-circuited and a current source 23 is connected to the bases of the transistors T3 and T4 in place of the current source 21 commonly connected to the emitters of the NPN transistors T3 and T4, and that MOS transistors E and F as switching elements for switching ON/OFF the transistors T3 and T4 are connected to the emitters of the transistors T3 and T4 respectively.

Inputted into the gates of the transistors E and F are control signals each switching between HIGH and LOW at the same timing as that of input signals X and Y for the bases in Embodiment 1. Accordingly, when the transistor T1 and transistor T2 are ON and OFF respectively, the MOS transistor E and MOS transistor F are turned OFF and ON respectively, and the transistor T3 and transistor T4 are turned OFF and ON respectively. Conversely, when the transistor T1 and transistor T2 are OFF and ON respectively, the MOS transistor E and MOS transistor F are turned ON and OFF respectively, and the transistor T3 and transistor T4 are turned ON and OFF respectively.

Connected to the emitter of the transistor 22 is a MOS transistor G for adjusting resistance of the current mirror circuit. It should be noted that configuration of the other sections and the effects due to Embodiment are the same as those in Embodiment 1, and so the same reference numerals are assigned to the sections corresponding to those in Embodiment 1, and description thereof is omitted herein.

With Embodiment 2, ON/OFF of the transistor T3 and transistor T4 is switched by the MOS transistors E and F connected to the emitters thereof respectively, so that switching ON/OFF of the transistor T3 and transistor T4 is speeded up as compared to that in Embodiment 1, which allows the direction of a write current to be switched more speedily.

In addition, with Embodiment 2, since the resistance of the MOS transistors E and F when they are ON is almost zero, voltage drop at those MOS transistors E and F is smaller as compared to a case where the current source is connected to the transistors T3 and T4, so that a wide dynamic range of a write current can also be obtained.

Figure 5:
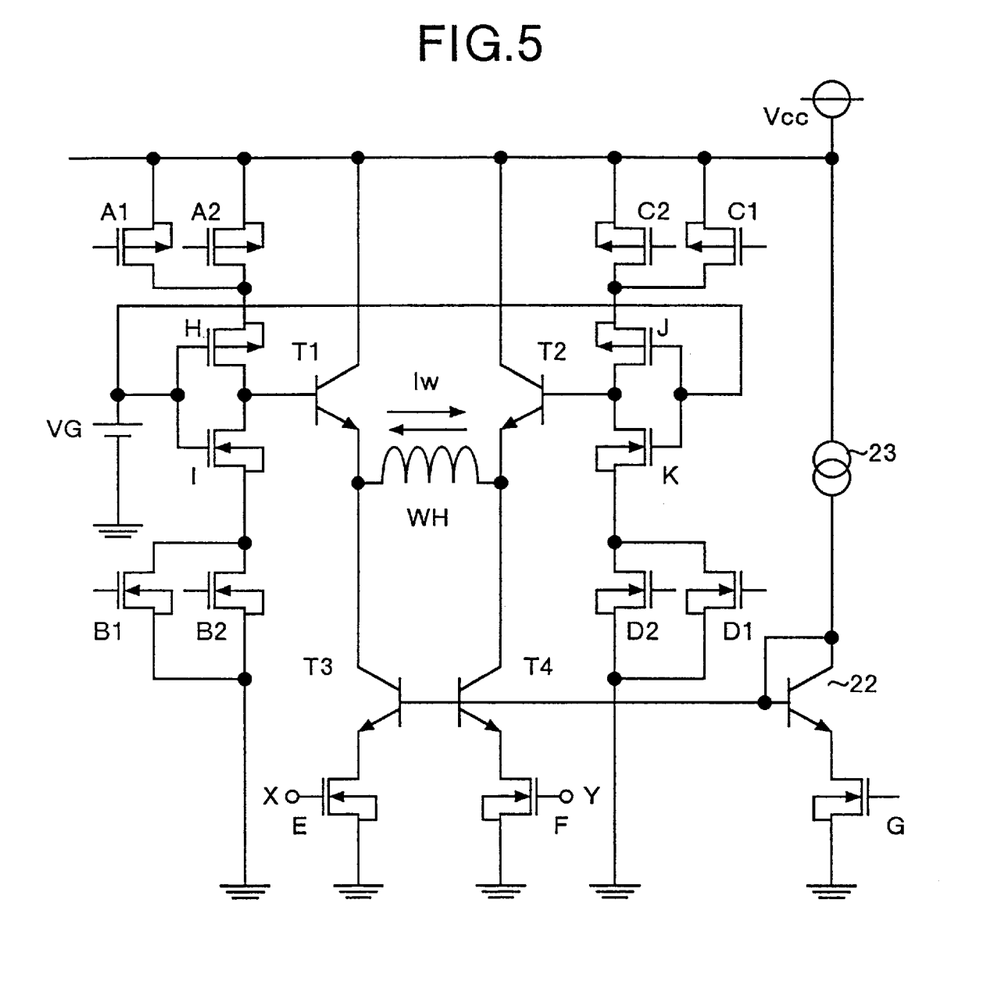
FIG. 5 is a circuit diagram showing Embodiment 3 of the present invention.

FIG. 5 is a circuit diagram showing Embodiment 3 of the write current driving circuit according to the present invention. This write current driving circuit is configured, using the Embodiment 2 shown in FIG. 4, so that the current-supply NPN transistors T1 and T2 are turned ON/OFF respectively by an output from the CMOS inverter circuit alternately gate-grounded through a constant-voltage source VG. Namely, in the side of the transistor T1, a PMOS transistor H and a NMOS transistor I alternately gate-grounded through the constant-voltage source VG are cascaded between the MOS transistors A1, A2 and the MOS transistors B1, B2 by means of source-drain connection respectively, and the base of the transistor T1 is commonly connected to the drains of the transistors H and I.

In the side of the current-supply NPN transistor T2, a PMOS transistor J and a NMOS transistor K alternately gate-grounded through the constant-voltage source VG are cascaded between the MOS transistors C1, C2 and the MOS transistors D1, D2 by means of source-drain connection respectively, and the base of the transistor T2 is commonly connected to the drains of the transistors J and K. As the configuration of the other sections is the same as that in Embodiment 2 description thereof is omitted herein.

With Embodiment 3, since influence to an input capacitor can be made smaller by means of the cascade connection, switching ON/OFF of the transistors T1 and T2 can further be speeded up, which allows the direction of a write current to be switched more speedily.

Figure 6:
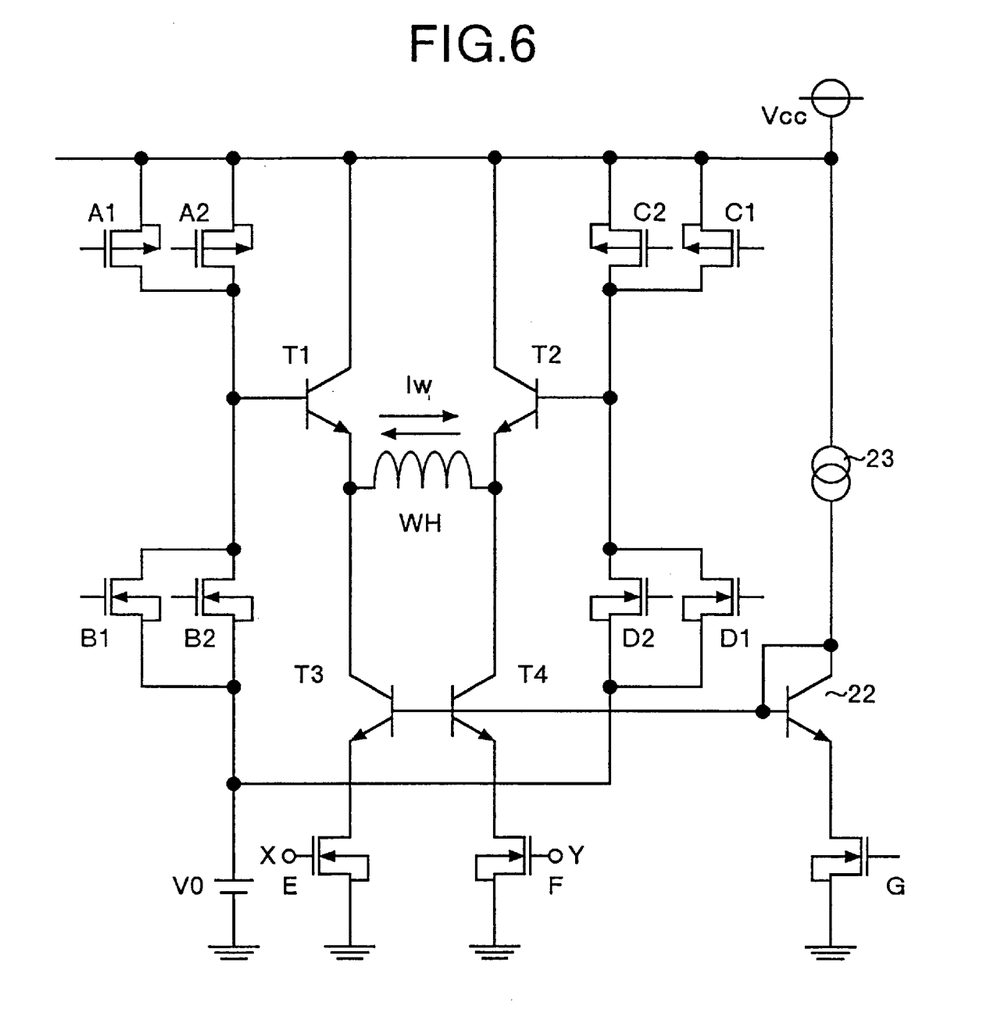
FIG. 6 is a circuit diagram showing Embodiment 4 of the present invention.

FIG. 6 is a circuit diagram showing Embodiment 4 of the write current driving circuit according to the present invention. This write current driving circuit is configured, using the Embodiment 2 shown in FIG. 4, so that the sources of the current-extraction NMOS transistors B1, B2, D1, and D2 are connected to a constant-voltage source VO and the source potential of those transistors B1, B2, D1, and D2 is set to a specified potential so as to maintain the voltage so that it does not saturate the collector potential of the transistors T3 and T4 when the transistors T3 and T4 are OFF. As the configuration of the other sections is the same as that in Embodiment 2 description thereof is omitted herein.

With Embodiment 4, it is possible to prevent the collector potential of the transistors T3 and T4 to approach a potential close to the ground potential and get saturated when the transistors T3 and T4 are OFF, so that a time required for switching ON/OFF of the transistors T3 and T4 is reduced, which allows the direction of a write current to be switched more speedily.

Figure 7:
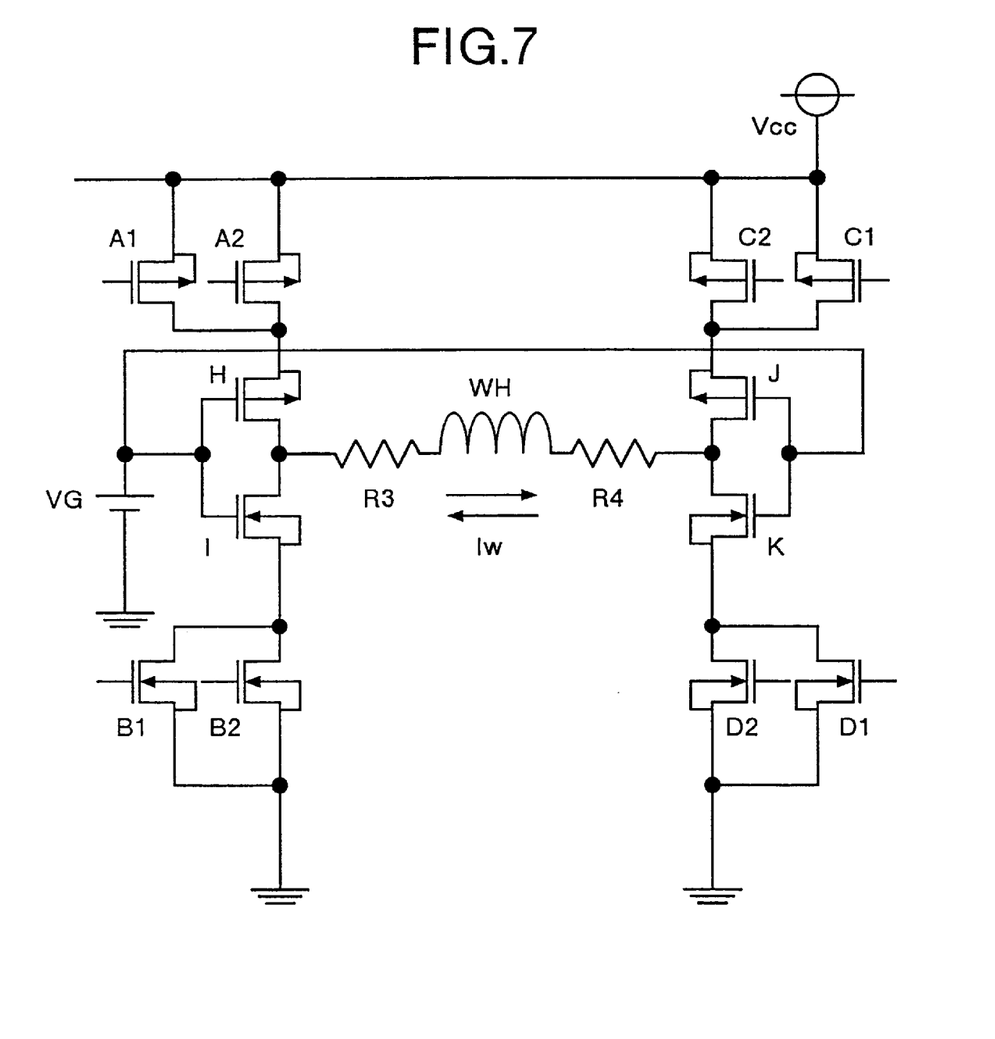
FIG. 7 is a circuit diagram showing Embodiment 5 of the present invention.

FIG. 7 is a circuit diagram showing Embodiment 5 of the write current driving circuit according to the present invention. This write current driving circuit has the same connection as that in Embodiment 3 shown in FIG. 5 among the current-supply PMOS transistors A1, A2, H, C1, C2 and J, the current-extraction NMOS transistors B1, B2, I, D1, D2 and K, and the constant-voltage source VG, and one end of a resistor R3 and one end of a resistor R4 are connected to the two ends of the write head WH in series respectively, and the other end of the resistor R3 is commonly connected to the drains of the transistors H and I, and the other end of the resistor R4 is commonly connected to the drains of the transistors J and K, and so a write current is driven by means of detection of voltage.

In Embodiment 5, a direction and an amount of a write current is decided by the resistance of the resistors R3 and R4 as well as by the voltage between the other end of the resistor R3 and the other end of the resistor R4. Description of the sections that overlap those in Embodiment 3 is omitted herein.

With Embodiment 5, the transistors T1 T2, T3, and T4 are not required therein, the current mirror circuit is not required, and further the MOS transistors E, F, and G are also not required although all of the components are provided in Embodiment 3, and so there are a smaller number of elements herein which is an advantage, and a write current is directly switched by switching ON/OFF among the MOS transistors H, I, J, and K, which allows the direction of the write current to be switched more speedily.

Although the present invention has been described with respect to specific embodiments for a complete and clear disclosure, the appended claims are not to be thus limited but are to be construed as embodying all modifications and alternative constructions that may occur to one skilled in the art which fairly fall within the basic teaching herein set forth.

As described above, with the present invention, the ON/OFF state of a first PMOS transistor and a first NMOS transistor switches complementarily, the ON/OFF state of the first PMOS transistor and a second PMOS transistor switches complementarily, and the ON/OFF state of a second PMOS transistor and a second NMOS transistor switches complementarily, and so a direction of a current passing through a resistive element changes in response to switching of the ON/OFF state among those PMOS transistors and NMOS transistors, and only when the first PMOS transistor, second PMOS transistor, first NMOS transistor, and second NMOS transistor switch from an OFF state to an ON state, the third PMOS transistor, fourth PMOS transistor, third NMOS transistor, and fourth NMOS transistor are turned ON, which allows the direction of a current passing through a resistive element to be switched speedily with suppressed current drain.

With another aspect of the present invention, ON/OFF of a first current-supply transistor is switched in response to switching of the ON/OFF state of the first PMOS transistor and first NMOS transistor, and ON/OFF of a second current-supply transistor is switched in response to switching of the ON/OFF state of the second PMOS transistor and second NMOS transistor, which allows the direction of a current passing through a resistive element to be switched speedily with suppressed current drain.

With another aspect of the present invention, ON/OFF of a first current-extraction transistor and a second current-extraction transistor is switched by the switching elements connected to the emitters thereof respectively, which allows the direction of a write current to be switched more speedily.

With another aspect of the present invention, ON/OFF of a first current-supply transistor and a second current-supply transistor is switched according to outputs from a first CMOS inverter circuit and a second CMOS inverter circuit, which allows the direction of a write current to be switched more speedily.

With another aspect of the present invention, source potentials of a first NMOS transistor, a second NMOS transistor, a third NMOS transistor, and a fourth NMOS transistor are maintained at a higher prespecified potential as compared to a ground potential, so that a time required for switching the OFF to the ON state of the first current-extraction transistor and second current-extraction transistor is reduced, which allows the direction of a write current to be switched more speedily.

What is claimed is:

1. A write current driving circuit comprising:
   a first PMOS transistor;
   a first NMOS transistor switching ON/OFF conversely to said first PMOS transistor;
   a second PMOS transistor;
   a second NMOS transistor switching ON/OFF conversely to said second PMOS transistor;
   a circuit element connected to a node between a drain of said first PMOS transistor and a drain of said first NMOS transistor and a node between a drain of said second PMOS transistor and a drain of said second NMOS transistor;
   a third PMOS transistor connected in parallel with said first PMOS transistor and kept ON for a specified period of time from a point of time when a signal for switching said first PMOS transistor from an OFF state to an ON state is inputted into said first PMOS transistor until a point of time before said first PMOS transistor is turned OFF again;
   a fourth PMOS transistor connected in parallel with said second PMOS transistor and kept ON for a specified period of time from a point of time when a signal for switching said second PMOS transistor from an OFF state to an ON state is inputted into said second PMOS transistor until a point of time before said second PMOS transistor is turned OFF again;
   a third NMOS transistor connected in parallel with said first NMOS transistor and kept ON for a specified period of time from a point of time when a signal for switching said first NMOS transistor from an OFF state to an ON state is inputted into said first NMOS transistor until a point of time before said first NMOS transistor is turned OFF again; and
   a fourth NMOS transistor connected in parallel with said second NMOS transistor and kept ON for a specified period of time from a point of time when a signal for switching said second NMOS transistor from an OFF state to an ON state is inputted into said second NMOS transistor until a point of time before said second MOS transistor is turned OFF again.

2. A write current driving circuit according to claim 1, wherein said circuit element comprises:
   a first current-supply transistor connected to the upstream side of one end of a resistive element with the base potential biased by said first PMOS transistor as well as by said first NMOS transistor;
   a first current-extraction transistor connected to the downstream side of said one end of said resistive element and switching ON/OFF conversely to said first current-supply transistor;
   a second current-supply transistor connected to the upstream side of the one end of said resistive element with the base potential biased by said second PMOS transistor and said second NMOS transistor; and
   a second current-extraction transistor connected to the downstream side of the other end of said resistive element and switching ON/OFF conversely to said second current-supply transistor.

3. A write current driving circuit according to claim 2, further comprising a switching element connected between the emitters of said first current-extraction transistor and said second current-extraction transistor respectively and an ON/OFF state of said first current-extraction transistor and said second current-extraction transistor is switched using said switching element.

4. A write current driving circuit according to claim 1, further comprising:
   a first CMOS inverter circuit cascade-connected between a drain of said first PMOS transistor and a drain of said first NMOS transistor, and alternately gate-grounded; and
   a second CMOS inverter circuit cascade-connected between a drain of said second PMOS transistor and a drain of said second NMOS transistor and alternately gate-grounded,
   wherein a base potential of said first current-supply transistor is biased according to an output from said first CMOS inverter circuit and a base potential of said second current-supply transistor is biased according to an output from said second CMOS inverter circuit.

5. A write current driving circuit according to claim 1, wherein source potentials of said first NMOS transistor, said second NMOS transistor, said third NMOS transistor, and said fourth NMOS transistor are kept at a higher prespecified potential as compared to a ground potential.

* * * * *